United States Patent
Mizrachi et al.

(10) Patent No.: US 7,100,103 B2
(45) Date of Patent: Aug. 29, 2006

(54) EFFICIENT METHOD FOR FAST DECODING OF BCH BINARY CODES

(75) Inventors: Shay Mizrachi, Hod Hasharon (IL); Daniel Stopler, Holon (IL)

(73) Assignee: Broadcom Corporation, Irvine, CA (US)

( * ) Notice: Subject to any disclaimer, the term of this patent is extended or adjusted under 35 U.S.C. 154(b) by 467 days.

(21) Appl. No.: 10/348,826

(22) Filed: Jan. 22, 2003

(65) Prior Publication Data
US 2003/0159103 A1 Aug. 21, 2003

Related U.S. Application Data

(60) Provisional application No. 60/350,652, filed on Jan. 22, 2002.

(51) Int. Cl.
*H03M 13/00* (2006.01)
(52) U.S. Cl. .................................... 714/782
(58) Field of Classification Search ............... 714/781, 714/782, 784, 785, 755, 759
See application file for complete search history.

(56) References Cited

U.S. PATENT DOCUMENTS

| | | | | |
|---|---|---|---|---|
| 4,597,083 A | * | 6/1986 | Stenerson | 714/753 |
| 4,675,869 A | * | 6/1987 | Driessen | 714/759 |
| 6,532,565 B1 | * | 3/2003 | Roth et al. | 714/761 |

OTHER PUBLICATIONS

"Error Control Coding: Fundamentals and Applications", by Shu Lin and Daniel J. Costello, (Prentice-Hall, 1983). pp. 51-81, 141-155.

* cited by examiner

*Primary Examiner*—Shelly Chase
(74) *Attorney, Agent, or Firm*—McAndrews, Held & Malloy, Ltd.

(57) ABSTRACT

A method for decoding a received word, including calculating a syndrome of the received word as a plurality of binary element vectors, generating respective logarithms of the binary element vectors, and determining, in response to the logarithms, an indication of a position of an erroneous bit in the received word.

30 Claims, 4 Drawing Sheets

EFFICIENT METHOD FOR FAST DECODING OF BCH BINARY CODES

CROSS REFERENCE TO RELATED APPLICATIONS

This application claims the benefit of U.S. Provisional Patent Application No. 60/350,652 filed Jan. 22, 2002, which is incorporated herein by reference.

FIELD OF THE INVENTION

The present invention relates generally to microprocessors and specifically to error detection and correction (EDAC) codes implemented by microprocessors.

BACKGROUND OF THE INVENTION

Contents of memory chips are often corrupted by bit-flips caused by single event upsets. An Error Detection and Correction Code (EDAC code) is commonly used to protect against such errors and preserve the original intended memory content. To implement an EDAC code, a string transmitted to memory is divided into message units which are respectively encoded prior to being put into memory and are then decoded when fetched from memory. The use of EDAC codes is not limited to memory chips. EDAC codes are implemented in many hardware applications wherein the transmitted string risks being corrupted. For example, EDAC codes are implemented to resolve transmission errors found in network communications.

There are several goals in any EDAC implementation:

To maximize effectiveness, as measured by the number of potential errors identified and the number of errors that are corrected automatically;

To maximize speed, equivalent to minimizing a number of processing cycles required;

To minimize other resources required to support the overhead of the EDAC implementation.

Shu Lin and Daniel J. Costello, in *Error Control Coding: Fundamentals and Applications* (Prentice-Hall, 1983), categorize, describe and validate mathematically several EDAC implementations. EDAC codes that process each message respectively independent of information found in the other messages are referred to as memory-less. Since memory and other applications of EDAC codes are implemented using digital circuits, typical EDAC codes are binary. Typically, the codes are systematic, i.e., a vector (the coded message) produced by the encoding process comprises both an original input vector (the information message) and additional bits (parity-check bits). In the description below, each coded message is assumed to be n bits long, each information message to be k bits long, (k<n), in which case the number of parity-check bits is n−k; the codes are also referred to as (n,k) codes.

For an (n,k) code there are a total of $2^k$ possible information messages, which an encoder transforms into a set of $2^k$ coded messages, each coded message having a length of n bits. The set of $2^k$ coded messages is referred to as a block code. It will be understood that since n>k, not all of the $2^n$ possible bit combinations map to the $2^k$ possible information messages. The subset of the $2^n$ combinations that do map to the $2^k$ possible information messages are referred to as code words. A linear (n,k) code is a specific type of block code, known in the art, for which encoding complexity is low.

Herein, unless otherwise stated, the terms code, linear code, and EDAC code refer to linear systematic binary EDAC codes.

A distance between any two vectors of a code may be defined as the number of bits that differ in the two vectors. A minimum distance ($d_{min}$) of a linear block code is defined as the minimum distance between all permutations of two vectors within the code. An EDAC code in which n−k is large will have a greater $d_{min}$ than will a code in which n−k is small. That is, $d_{min}$ is a function of the particular code implemented.

The number of erroneous bits that can be automatically corrected by any specific EDAC implementation (herein known as the error-correcting capability) is typically represented by the letter t.

BCH codes (named for their inventors, Bose, Chaudhuri, and Hocquenghem) provide a robust EDAC implementation, wherein the error-correction value t is typically greater than 1. For example, a subclass of BCH codes possesses the following parameters, wherein $m \geq 3$ and $t < 2^{m-1}$, m,t both integers:

Block length (n)=$2^m-1$

Number of parity-check bits: n−k$\leq$mt information bits (k)=$2^m-m-1$

Minimum distance ($d_{min}$)$\geq$2t+1

For example, if m=7 and t=2, the coded and information message lengths are 127 and 113 bits respectively, 14 parity-check bits are used, and 2 error bits in the information message can be automatically corrected by the code. Inter alia, BCH codes are cyclic codes and thus possess an inherent algebraic structure.

BCH codes, as well as other EDAC codes, may be encoded using a Generator Matrix, as described below. The mapping of the $2^k$ possible information messages, each of length k, to the $2^k$ code words, each of length n, can be described mathematically as a vector matrix multiplication:

Let u represent an information message; u is a row vector of length k;

Let v represent the code word assigned to u; v is a row vector of length n;

Let G represent a matrix of k rows and n columns; G is known as the Generator Matrix for the (n,k) code and is assumed to be composed from a P matrix and an identity matrix of k rows and k columns ($I_k$). P is a matrix having k rows and n−k columns, with elements having a value 0 or 1.

The Generator Matrix is defined by the equation:

$$G=[P I_k]$$

The code word v is generated by the equation:

$$v=u \cdot G$$

Implementing vector-matrix multiplication in digital circuits, in which all values are binary, is relatively simple. Each position $v_i$ in v is a sum of a set of bit positions within u, so that each $v_i$ is given by a linear equation. Since a Modulo-2 addition operation is equivalent to an XOR operation, each of the equations may be implemented by a series of XOR gates activated in parallel. It will be understood that for any given EDAC code, G is a fixed matrix and so the group of equations corresponding to the complete u·G operation can be implemented as circuitry that outputs elements $v_i$ as solutions of the equations. Due to the inherent speed of XOR gates, and using parallel processing, the u·G operation can typically be completed using one microprocessor cycle.

Typically, the decoding process of BCH codes uses more processing cycles than the encoding process. Decoding BCH codes comprises three distinct steps, processed respectively for each received vector r:

1. Syndrome calculation
2. Defining the error pattern
3. Correcting the erroneous bits The first and third steps consume relatively few cycles. As will be explained below, the second step has the largest overhead and, therefore, any processing cycle reduction in this step can significantly increase the overall decoding speed.

Referring to the first step, a syndrome s is a vector of length m·t that indicates whether the received vector r is a code word. If the syndrome comprises only binary 0s, then r is a code word. Any other syndrome value indicates that r is not a code word.

The syndrome is calculated as follows:

A parity-check matrix, H, is derived from G by the equation:

$$H = [I_{n-k} | P^T]$$

where $p^T$ is the transpose of P.

Let r be a received vector (in the form of a row)

Then, by definition, the syndrome s of r is an (n–k) tuple given by $$s = r \cdot H^T = (s_0, s_1, s_2, \ldots, s_{n-k-1}) \quad (1a)$$

An equivalent equation for the syndrome when r is in the form of a column is given by:

$$s = H \cdot r = \begin{bmatrix} s_0 \\ s_1 \\ s_2 \\ \vdots \\ s_{n-k-1} \end{bmatrix} \quad (1b)$$

For a given G, H is predefined. Since H·r is a vector-matrix multiplication, it can be performed using a technique substantially similar to that described above (for encoding formula v=u·G), i.e., as circuitry outputting elements of s. The circuitry uses a similar number of microprocessor cycles to generate the elements.

In general, matrix H may be written in the following form, using a primitive Galois Field element α:

$$H = \begin{bmatrix} 1 & \alpha & \alpha^2 & \alpha^3 & \cdots & \alpha^{n-1} \\ 1 & (\alpha^2) & (\alpha^2)^2 & (\alpha^2)^3 & \cdots & (\alpha^2)^{n-1} \\ 1 & (\alpha^3) & (\alpha^3)^2 & (\alpha^3)^3 & \cdots & (\alpha^3)^{n-1} \\ \vdots & & & & & \vdots \\ 1 & (\alpha^{2t}) & (\alpha^{2t})^2 & (\alpha^{2t})^3 & \cdots & (\alpha^{2t})^{n-1} \end{bmatrix} \quad (2)$$

wherein the entries in H are elements of a Galois Field $GF(2^m)$, expressed in terms of α.

For t-error-correcting BCH codes, every other row of H may be omitted, to give a reduced parity-check matrix H of the form:

$$H = \begin{bmatrix} 1 & \alpha & \alpha^2 & \alpha^3 & \cdots & \alpha^{n-1} \\ 1 & (\alpha^3) & (\alpha^3)^2 & (\alpha^3)^3 & \cdots & (\alpha^3)^{n-1} \\ 1 & (\alpha^5) & (\alpha^5)^2 & (\alpha^5)^3 & \cdots & (\alpha^5)^{n-1} \\ \vdots & & & & & \vdots \\ 1 & (\alpha^{2t-1}) & (\alpha^{2t-1})^2 & (\alpha^{2t-1})^3 & \cdots & (\alpha^{2t-1})^{n-1} \end{bmatrix} \quad (3)$$

Since each element of H is equivalent to an m-tuple binary element column, the parity-check matrix H in a binary form has mt rows and n columns.

As is known in the art, elements of Galois Fields may be expressed as powers of α, as equivalent sums of powers of α, or as vectors. An example of equivalent representations of elements in $GF(2^3)$ is shown in Table I.

TABLE I

| Elements of $GF(2^3)$ | | |
|---|---|---|
| As a vector | As a sum | As a power |
| (0 0 0) | $0.1 + 0.\alpha + 0.\alpha^2$ | Undefined |
| (1 0 0) | $1.1 + 0.\alpha + 0.\alpha^2$ | $\alpha^0$ |
| (0 1 0) | $0.1 + 1.\alpha + 0.\alpha^2$ | $\alpha^1$ |
| (0 0 1) | $0.1 + 0.\alpha + 1.\alpha^2$ | $\alpha^2$ |
| (1 1 0) | $1.1 + 1.\alpha + 0.\alpha^2$ | $\alpha^3$ |
| (1 1 1) | $1.1 + 1.\alpha + 1.\alpha^2$ | $\alpha^4$ |
| (1 0 1) | $1.1 + 0.\alpha + 1.\alpha^2$ | $\alpha^5$ |

After calculating the syndrome, the second step of BCH decoding uses the syndrome (the output of step 1) to locate and correct the erroneous bits. Processes known in the art for performing this step typically use a large number of processing cycles to determine coefficients of an error location polynomial σ from the syndrome components. The third step then finds the roots of σ, which give error positions in received vector r.

An alternative faster method, also known in the art, is to pre-define a look-up table, in which bit values of 1 in each row of the table give locations of erroneous bits.

The table used in this method has dimensions of $2^{mt}$ rows by mt columns. The syndrome is assumed to be a single binary number, of length mt, which indexes the table, and each indexed row shows the error bits (as 1s) for the syndrome. Thus, for a (127, 113) code, the syndrome is 14 bits long, and the table is $2^{14}$ rows by 14 columns. The table content for each row pointed to by the syndrome includes two pointers to two possible erroneous bits. Thus, the table size grows exponentially with mt and the memory resources needed for the table become prohibitive in typical microprocessor implementations.

SUMMARY OF THE INVENTION

The present invention seeks to provide fast decoding of BCH codes, without requiring large look-up tables. A syndrome produced by a received word is divided into sections, and each section acts as an index to a small look-up table. The results of the sections are combined, using another small look-up table, to find error-location positions in the received vector.

In preferred embodiments of the present invention, the syndrome of a received word, formed from a BCH code word, is generated as a binary element matrix having a number of rows corresponding to the error-correction capability t of the code. The value of each row is used as a respective index to a Galois Field logarithm look-up table, the same table being used for all rows, to generate respective logarithms of the rows. The order of the Galois Field table corresponds to the block length of the code. A difference is taken between the respective logarithms to generate a normalized error indication, which is used as a further index to an error-locating table that gives unadjusted pointers to error positions in the received word. The pointers are converted to final, correctly adjusted positions of the errors, by adding the logarithm of the first row of the binary element matrix to the unadjusted pointer values.

The Galois Field logarithm table and the error-locating table are extremely small compared to the decoding look-up tables that are used in methods known in the art, as described in the Background of the Invention. In addition, steps involved in using the tables may be performed in parallel, using pipeline processing, so that the number of processing cycles required to determine the error locations in the BCH code words is small. If pipeline processing is implemented, at least some parts of the Galois Field logarithm table and/or the error-locating table are preferably replicated, so as to further reduce the number of processing cycles required.

There is therefore provided, according to a preferred embodiment of the present invention, a method for decoding a received word, including:

calculating a syndrome of the received word as a plurality of binary element vectors;

generating respective logarithms of the binary element vectors; and determining, in response to the logarithms, an indication of a position of an erroneous bit in the received word.

Preferably, the received word is formed from a code word of a Bose, Chaudhuri, and Hocquenghem (BCH) code having an error-correction value greater than or equal to two, and the plurality is equal to the error-correction value. The error-correction value is preferably equal to two, and generating respective logarithms consists of generating a first logarithm log p and a second logarithm log q, and determining the indication consists of generating an index I to an error-locating table equal to an expression (log q−3log p).

The method preferably includes making a comparison of the index I with zero, and in response to the comparison determining that the erroneous bit includes a single erroneous bit.

Preferably, the method includes recovering an information message from the received word, and applying the indication of the position of the erroneous bit to the information message so as to determine an information word.

Generating the respective logarithms preferably includes using each of the binary vectors as an index to a Galois Field logarithm table.

Preferably, the received word is formed from a code word of a BCH code having a block length equal to $2^m-1$, wherein m is an integer greater than or equal to three, wherein a number of elements in each binary element vector is equal to m, and wherein the Galois Field logarithm table comprises elements of order $GF(2^m)$. The method preferably also includes providing adjustment circuitry which is adapted to adjust the indication of the position of the erroneous bit for m being an odd integer or an even integer.

Preferably, determining the indication includes generating an index to an error-locating table as a pre-determined function of the respective logarithms. The received word preferably includes a known-erroneous-bit-position word, wherein the position of the erroneous bit in the known-erroneous-bit-position word is known, and the method preferably includes generating the error-locating table using the known-erroneous-bit-position word. The known-erroneous-bit-position word preferably consists of a normalized error vector.

Preferably, the received word is formed from a code word of a BCH code having an error-correction value, and the error-locating table is implemented to generate the indication as a multiplicity of pointers, the multiplicity being equal to the error-correction value.

Further preferably, generating the index includes generating an adjustment to the index in response to at least one of the plurality of binary element vectors and the index.

The method preferably includes adjusting an output of the error-locating table in response to at least one of the plurality of binary element vectors and the index.

Preferably, generating the respective logarithms includes generating an index to an error-locating table as a pre-determined function of the respective logarithms, and determining the indication includes:

determining a plurality of pointers to respective positions of erroneous bits; and receiving from the error-locating table the plurality of pointers.

The method preferably also includes adjusting the plurality of pointers in response to an adjusting logarithm comprised in the logarithms, so as to determine respective positions of the erroneous bits.

There is further provided, according to a preferred embodiment of the present invention, apparatus for decoding a received word, including:

a processor which is adapted to:

calculate a syndrome of the received word as a plurality of binary element vectors, generate respective logarithms of the binary element vectors, and determine, in response to the logarithms, an indication of a position of an erroneous bit in the received word.

Preferably, the received word is formed from a code word of a Bose, Chaudhuri, and Hocquenghem (BCH) code having an error-correction value greater than or equal to two, and the plurality is equal to the error-correction value.

Further preferably, the error-correction value is equal to two, the respective logarithms include a first logarithm log p and a second logarithm log q, and the indication consists of an index I to an error-locating table formed from an expression (log q−3log p).

The processor is preferably adapted to make a comparison of the index I with zero, and in response to the comparison to determine that the erroneous bit consists of a single erroneous bit.

Preferably, the processor is adapted to recover an information message from the received word, and to apply the indication of the position of the erroneous bit to the information message so as to determine an information word.

The processor is preferably adapted to generate the respective logarithms using each of the binary element vectors as an index to a Galois Field logarithm table.

Preferably, the received word is formed from a code word of a BCH code having a block length equal to $2^m-1$, wherein m is an integer greater than or equal to three, wherein a number of elements in each binary element vector is equal to m, and the Galois Field logarithm table includes elements of order $GF(2^m)$.

The apparatus preferably further includes adjustment circuitry which is adapted to adjust the indication of the position of the erroneous bit for m being an odd integer or an even integer.

Preferably, the indication includes an index to an error-locating table as a pre-determined function of the respective logarithms.

Preferably, the received word includes a known-erroneous-bit-position word, wherein the position of the erroneous bit in the known-erroneous-bit-position word is known, and the processor is adapted to generate the error-locating table using the known-erroneous-bit-position word. The known-erroneous-bit-position word preferably includes a normalized error vector.

Preferably, the received word is formed from a code word of a BCH code having an error-correction value, and the error-locating table is implemented to generate the indication as a multiplicity of pointers, the multiplicity being equal to the error-correction value.

The apparatus preferably also includes adjustment circuitry which is adapted to generate an adjustment to the index in response to at least one of the plurality of binary element vectors and the index. The adjustment circuitry is preferably adapted to adjust an output of the error-locating table in response to at least one of the plurality of binary element vectors and the index.

The processor is preferably adapted to generate an index to an error-locating table as a pre-determined function of the respective logarithms, and the indication includes a plurality of pointers to respective positions of erroneous bits, and the processor is adapted to receive from the error-locating table the plurality of pointers.

Preferably, the processor is adapted to adjust the plurality of pointers in response to an adjusting logarithm included in the logarithms, so as to determine respective positions of the erroneous bits.

The present invention will be more fully understood from the following detailed description of the preferred embodiments thereof, taken together with the drawings in which:

DETAILED DESCRIPTION OF PREFERRED EMBODIMENTS

Figure 1:
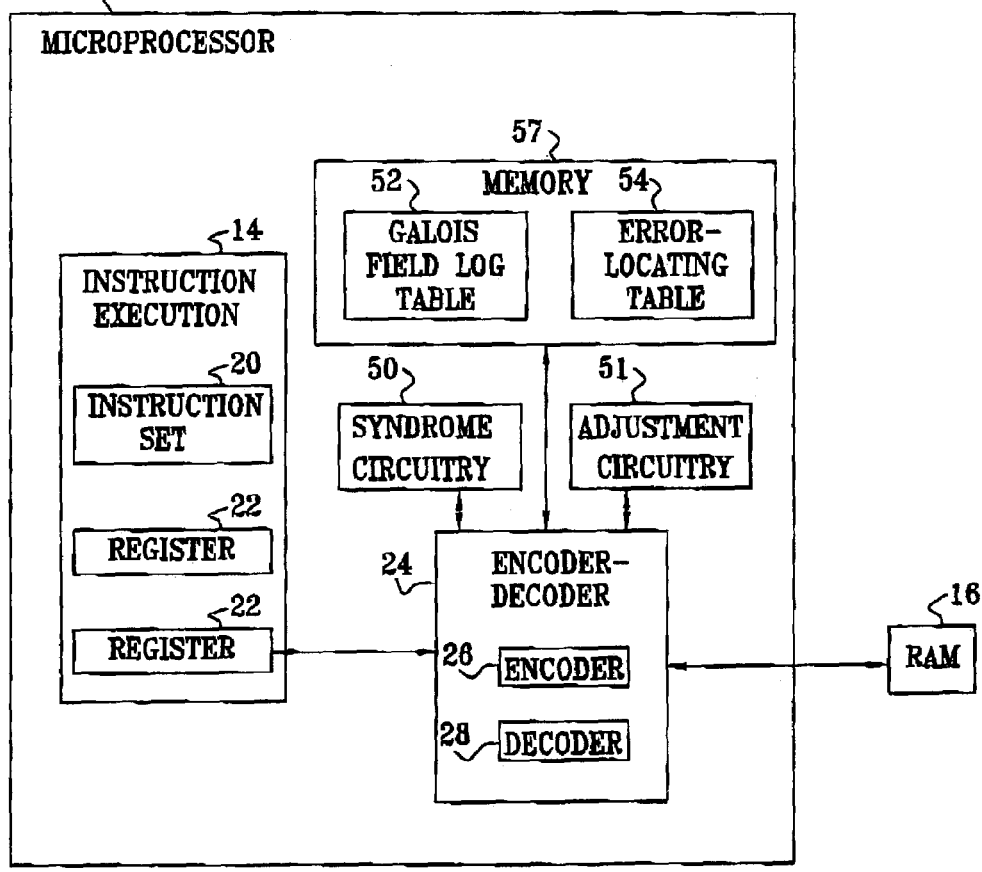
FIG. 1 is a block diagram that schematically illustrates a microprocessor including an encoder-decoder, according to a preferred embodiment of the present invention.

FIG. 1 is a block diagram that schematically illustrates an architecture 10 of a microprocessor 12 and a random access memory (RAM) 16 containing user data, according to a preferred embodiment of the present invention. Microprocessor 12 acts as a processor of a received word, and includes an instruction execution module 14 and an encoder-decoder 24, Encoder-decoder 24 functions as a gate between generally similar registers 22 (in module 14) and RAM 16 and comprises an encoder 26 and a decoder 28. The encoder-decoder is configured to encode and decode BCH codes.

Instruction execution module 14 comprises an instruction set 20 that process data contained in registers 22. The instruction set and the registers most preferably comprise instructions and registers that are known in the art, such as those comprised in a reduced instruction set computer (RISC).

Microprocessor 12 most preferably comprises syndrome circuitry 50 that operates on the received code word so as to perform matrix multiplication on the word. Circuitry substantially similar to circuitry 50 is described in the Background of the Invention. Circuitry 50 is implemented so as to output results equivalent to multiplying the received code word by a parity-check matrix H, also described in the Background of the Invention. The circuitry generates elements of a syndrome s of the received code word in a format described in more detail below.

Optionally, microprocessor 12 comprises adjustment circuitry 51, the function of which is described in more detail below with respect to FIG. 5.

Microprocessor 12 also comprises one or more substantially similar Galois Field logarithm tables 52 and one or more substantially similar error-locating tables 54. Preferably, tables 52 and 54 are stored in a memory 57 of the microprocessor. Alternatively or additionally, at least some of tables 52 and 54 are stored as memory elements in RAM 16. The functions and construction of tables 52 and 54 are described in more detail below. Most preferably, microprocessor 12 is implemented as a custom device such as an application specific integrated circuit (ASIC). Alternatively, at least some elements of the microprocessor may be implemented as discrete or semi-discrete devices.

Figure 2:
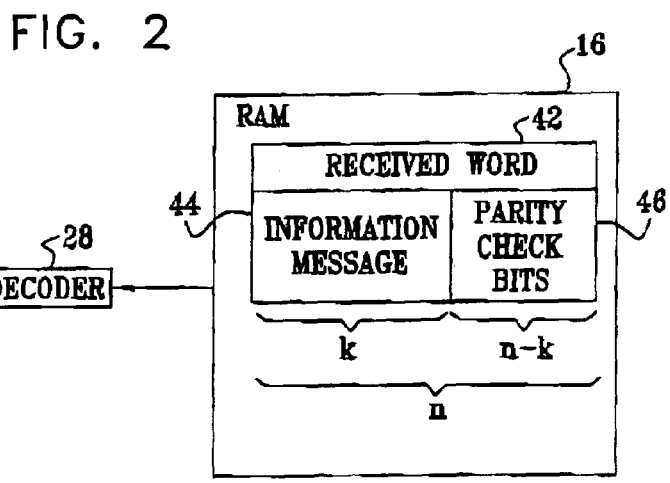
FIG. 2 is a block diagram that schematically illustrates a decoder, a specific register, and a Random Access Memory, according to a preferred embodiment of the present invention.

FIG. 2 is a block diagram that schematically illustrates decoder 28, a specific register 22, and RAM 16, in more detail, according to a preferred embodiment of the present invention. Register 22 has as its content an information word 41. RAM 16 has as its content a received word 42.

The received word consists of an information message 44, comprising the more significant bits of the received word, and parity-check bits 46 comprising the less significant bits of the received word. The length of information word 41 and of information message 44 are assumed to be k bits. If no errors occur as information is transferred between RAM 16 and register 22 then information word 41 and information message 44 are identical. However, one or more errors may be introduced in the transfer, or may be introduced when received word 42 is stored in RAM 16, for example if received word 42 has been received over a transmission line, or may be introduced, for example as a single event upset, while the received word is in the RAM. The length of received word 42 is assumed to be n bits, so that the length of parity-check bits 46 is n–k bits. It will be understood that decoder 28 converts a received word of length n to an information word of length k. While the above description refers to error introduction in data transfer from RAM 16 to register 22 via decoder 28, it will be understood that the scope of the present invention comprises detection and correction of errors in substantially any type of data transfer via decoder 28, such as occurs in data transfer via a communication channel, or between a communication channel and another entity such as a memory.

Unless otherwise stated, in the following description decoder 28 is assumed to operate, by way of example, on received words of a (127, 113) BCH code having n=127, k=113, m=7, and t=2, where n, k, m, and t represent elements of the code formed by a Generator Matrix G, as described in the Background of the Invention.

Table 52 (FIG. 1) comprises all $2^m-1$ defined elements $GF(2^m)$, expressed as an m-tuple and as a corresponding power z of a primitive element $\alpha$, $\alpha^z$. (Tables of defined elements $GF(2^m)$ for $3 \leq m \leq 10$ are provided in Appendix A of *Error Control Coding: Fundamentals and Applications*, referred to in the Background of the Invention.) The z-value of table 52 corresponding to the m-tuple vector (0 0 . . . 0), having an undefined $\alpha^z$, is set to be equal to $2^m-1$. For the example considered herein, m=7, so that there are 128 $GF(2^7)$ elements in table 52. A partial listing of elements in table 52, when m=7, is given below in Table II (those elements of table 52 not shown in Table II comprise the other defined $GF(2^m)$ elements). Table II also shows the m-tuple vectors for convenience as decimal values. It will be understood that z, the power of $\alpha$, is equal to logarithm to base $\alpha$ of $\alpha^z$, i.e., $z = \log_\alpha(\alpha^z)$. In the case of ($\alpha^z$) being undefined, $\log_\alpha(\alpha^z)$ is defined to be 127.

TABLE II

Partial Listing of Elements $GF(2^7)$

| As 7-tuple vector | As "decimal" vector | $\alpha^z$ | $\log_\alpha(\alpha^z) = z$ |
|---|---|---|---|
| 0 0 0 0 0 0 0 | 0 | Undefined | Undefined; set to 127 |
| 1 0 0 0 0 0 0 | 1 | $\alpha^0$ | 0 |
| 0 1 0 0 0 0 0 | 2 | $\alpha^1$ | 1 |
| 0 1 0 0 1 1 1 | 114 | $\alpha^{20}$ | 20 |
| 1 0 0 0 0 1 1 | 97 | $\alpha^{49}$ | 49 |
| 1 1 0 1 1 1 1 | 123 | $\alpha^{98}$ | 98 |
| 1 1 1 0 1 1 1 | 119 | $\alpha^{100}$ | 100 |
| 0 1 1 1 0 1 0 | 46 | $\alpha^{116}$ | 116 |
| 0 1 1 0 0 1 0 | 38 | $\alpha^{122}$ | 122 |
| 1 0 0 0 1 0 0 | 17 | $\alpha^{124}$ | 124 |
| 0 1 0 0 0 1 0 | 34 | $\alpha^{125}$ | 125 |
| 0 0 1 0 0 0 1 | 68 | $\alpha^{126}$ | 126 |

Although Table II is shown as a four column table for explanation, it will be appreciated that Galois Field logarithm table 52 only requires two columns, the first vector column and the last logarithm column of Table I. For $GF(2^7)$, both columns comprise 7-tuple vectors, since values for the logarithms range from 0 to 127.

Referring back to equation (3) of the Background of the Invention, for the (127, 113) code, the reduced parity-check matrix H, becomes:

$$H = \begin{bmatrix} 1 & \alpha & \alpha^2 & \alpha^3 & \cdots & \alpha^{126} \\ 1 & (\alpha^3) & (\alpha^3)^2 & (\alpha^3)^3 & \cdots & (\alpha^3)^{126} \end{bmatrix} \quad (4)$$

H is a two row matrix corresponding to t=2. As described with reference to equation (3), a matrix $H_{bin}$ in binary element form, equivalent to matrix H, is a matrix of 14 rows by 127 columns:

$$H_{bin} = \begin{bmatrix} 1 & 0 & \cdots & 0 \\ 0 & 1 & \cdots & 0 \\ 0 & 0 & \cdots & 1 \\ 0 & 0 & \cdots & 0 \\ 0 & 0 & \cdots & 0 \\ 0 & 0 & \cdots & 0 \\ 0 & 0 & \cdots & 1 \\ 1 & 0 & \cdots & 1 \\ 0 & 0 & \cdots & 0 \\ 0 & 0 & \cdots & 0 \\ 0 & 1 & \cdots & 0 \\ 0 & 0 & \cdots & 1 \\ 0 & 0 & \cdots & 0 \\ 0 & 0 & \cdots & 0 \end{bmatrix} \quad (5)$$

Syndrome s is given by equation (6) below, corresponding to equation (1b) of the Background of the Invention:

$$s = H_{bin} \cdot r = \begin{bmatrix} 1 & 0 & \cdots & 0 \\ 0 & 1 & \cdots & 0 \\ 0 & 0 & \cdots & 1 \\ 0 & 0 & \cdots & 0 \\ 0 & 0 & \cdots & 0 \\ 0 & 0 & \cdots & 0 \\ 0 & 0 & \cdots & 1 \\ 1 & 0 & \cdots & 1 \\ 0 & 0 & \cdots & 0 \\ 0 & 0 & \cdots & 0 \\ 0 & 1 & \cdots & 0 \\ 0 & 0 & \cdots & 1 \\ 0 & 0 & \cdots & 0 \\ 0 & 0 & \cdots & 0 \end{bmatrix} \cdot \begin{bmatrix} r_0 \\ r_1 \\ \vdots \\ r_{126} \end{bmatrix} = \begin{bmatrix} s_0 \\ s_1 \\ s_2 \\ s_3 \\ s_4 \\ s_5 \\ s_6 \\ s_7 \\ s_8 \\ s_9 \\ s_{10} \\ s_{11} \\ s_{12} \\ s_{13} \end{bmatrix} \quad (6)$$

where $s_0, s_1, \ldots, s_{13}$ are binary elements of syndrome s. Equation (6) may be rewritten as follows:

$$s = \begin{bmatrix} s_0 \\ s_1 \\ s_2 \\ s_3 \\ s_4 \\ s_5 \\ s_6 \\ s_7 \\ s_8 \\ s_9 \\ s_{10} \\ s_{11} \\ s_{12} \\ s_{13} \end{bmatrix} = \begin{bmatrix} s_0 & s_1 & s_2 & s_3 & s_4 & s_5 & s_6 \\ s_7 & s_8 & s_9 & s_{10} & s_{11} & s_{12} & s_{13} \end{bmatrix} = \begin{bmatrix} p \\ q \end{bmatrix} \quad (7)$$

where column matrix of equation (6) has been rearranged into two rows, and p and q are row vectors of length 7.

Returning to equation (4), an equivalent expression for s is given by:

$$s = \begin{bmatrix} 1 & \alpha & \alpha^2 & \alpha^3 & \ldots & \alpha^{126} \\ 1 & (\alpha^3) & (\alpha^3)^2 & (\alpha^3)^3 & \ldots & (\alpha^3)^{126} \end{bmatrix} \cdot \begin{bmatrix} r_0 \\ r_1 \\ \vdots \\ r_{126} \end{bmatrix} = \begin{bmatrix} \alpha^i \\ (\alpha^3)^j \end{bmatrix} \quad (8)$$

where $\alpha^i = r_0.1 + r_1.\alpha + \ldots + r_{126}.\alpha^{126}$,
$(\alpha^3)^j = r_0.1 + r_1.(\alpha^3)^1 + \ldots + r_{126}.(\alpha^3)^{126}$ and
$0 < i,j < 126$.

It will be appreciated that equating the linear sums $r_0.1 + r_1.\alpha + \ldots + r_{126}.\alpha^{126}$ and $r_0.1 + r_1.(\alpha^3)^1 + \ldots + r_{126}.(\alpha^3)^{126}$ to powers of $\alpha$ is possible because of the properties of primitive element $\alpha$, and that for the (127,113) code $\alpha^i$ and $(\alpha^3)^j$ are elements of $GF(2^7)$. Thus, from equations (7) and (8), s may be written:

$$s = \begin{bmatrix} \alpha^i \\ (\alpha^3)^j \end{bmatrix} = \begin{bmatrix} p \\ q \end{bmatrix} \quad (9)$$

It will be appreciated from equation (9) and the definition of $\alpha^i$ that if $p=0$, there is no error in the received word.

Circuitry 50 (FIG. 1) is implemented so as to provide outputs $(s_0, s_1, \ldots, s_6)$ and $(s_7, s_8, \ldots, s_{13})$ as respective binary element vectors equivalent to p and q.

The process described herein determines values of log p and log q for a received word using table 52. Decoder 28 then calculates an index I as a difference:

$$I = \mathrm{mod}(2^m - 1)[\log q - 3 \cdot \log p] \quad (10)$$

so that for the (127, 113) code where m=7, $$I = \mathrm{mod}(127)[\log q - 3 \cdot \log p] \quad (11)$$

Index I is used as an index to error-locating table 54. (In calculating I, log p is multiplied by −3 since $p = \alpha^i$ and $q = \alpha^{3j}$.) Index I, together with log p and log q, acts as an indication to positions of one or more erroneous bits in the received word. Error-locating table 54 generates, in response to I, pointers to "normalized" positions of erroneous bits in the received word. (The process of normalization is described in more detail below.) The pointers are then adjusted as required, using the initial value of log p, to determine actual positions of errors in the received word.

Erroneous bit positions in a received word may be written in the form of error vectors, where 1s indicate the error positions. For example, (0 1 0 0 0 0 0 0 . . . 0), (0 0 1 0 0 0 1 0 0 . . . 0), (0 0 0 0 1 0 0 0 1 0 0 . . . 0), (0 0 0 0 0 0 0 1 0 0 0 1 0 0 . . . 0) indicate errors in the second, the third and seventh, fifth and ninth, and eighth and twelfth positions of four received words. All such error vectors may be written as a normalized error location vector, where the normalization is performed by shifting the elements of the error vector left until the first element is 1. In the examples above, the normalization is implemented by left-shifting the error vectors by one space, two spaces, four spaces, and seven spaces respectively, giving one normalized error vector (1 0 0 0 0 0 0 . . . 0), and three identical normalized error vectors (1 0 0 0 1 0 0 . . . 0). It will be appreciated that for one error, there is only one normalized error vector (1 0 0 0 0 . . . 0). Thus for the (127, 113) code, which has 127 single error vectors, there is only one normalized single error vector. Similarly, the (127, 113) code has 127×63=8001 two-error vectors and 126 corresponding two-error normalized vectors. Thus the (127, 113) code with up to two errors, i.e., 8001+127=8128 error vectors, has a total of 126+1=127 normalized error vectors.

Error-locating table 54 (FIG. 1) may be considered as a normalized error position table. For the (127, 113) code, error-locating table 54 comprises three columns: index I and two error pointer columns E1, E2. Table 54 may be generated by creating known examples of the 127 normalized error vectors and forming respective syndromes of the vectors. The known examples are created by forming received code words with known erroneous bit positions. The error pointer values in the second and third columns of the table may then be generated since the positions of the errors of the created examples are known.

Error locating table 54 for the (127, 113) is listed below as Table III. In the listing, I is listed as a value between 0 and 255, since, as described below with reference to FIG. 4, I is calculated as an 8-tuple vector by adding two 7-tuple vectors corresponding to log q and −3log p.

TABLE III

| I | E1 | E2 |
|---|----|----|
| 0 | 1 | 0 |
| 1 | 0 | 0 |
| 2 | 0 | 0 |
| 3 | 0 | 0 |
| 4 | 0 | 0 |
| 5 | 0 | 0 |
| 6 | 0 | 0 |
| 7 | 102 | 30 |
| 8 | 0 | 0 |
| 9 | 0 | 0 |
| 10 | 0 | 0 |
| 11 | 108 | 55 |
| 12 | 0 | 0 |
| 13 | 0 | 0 |
| 14 | 76 | 59 |
| 15 | 101 | 91 |
| 16 | 0 | 0 |
| 17 | 0 | 0 |
| 18 | 0 | 0 |
| 19 | 89 | 19 |
| 20 | 0 | 0 |
| 21 | 29 | 13 |
| 22 | 108 | 88 |
| 23 | 124 | 121 |
| 24 | 0 | 0 |
| 25 | 70 | 18 |
| 26 | 0 | 0 |
| 27 | 85 | 34 |
| 28 | 117 | 24 |
| 29 | 0 | 0 |
| 30 | 74 | 54 |
| 31 | 125 | 5 |
| 32 | 0 | 0 |
| 33 | 0 | 0 |
| 34 | 0 | 0 |
| 35 | 0 | 0 |
| 36 | 0 | 0 |
| 37 | 8 | 4 |
| 38 | 50 | 37 |
| 39 | 0 | 0 |
| 40 | 0 | 0 |
| 41 | 98 | 97 |
| 42 | 57 | 25 |
| 43 | 0 | 0 |
| 44 | 90 | 48 |
| 45 | 0 | 0 |
| 46 | 120 | 114 |
| 47 | 0 | 0 |
| 48 | 0 | 0 |
| 49 | 103 | 62 |
| 50 | 35 | 12 |
| 51 | 75 | 21 |

TABLE III-continued

| I | E1 | E2 |
|---|---|---|
| 52 | 0 | 0 |
| 53 | 0 | 0 |
| 54 | 67 | 42 |
| 55 | 119 | 36 |
| 56 | 106 | 47 |
| 57 | 96 | 72 |
| 58 | 0 | 0 |
| 59 | 56 | 27 |
| 60 | 107 | 20 |
| 61 | 0 | 0 |
| 62 | 122 | 9 |
| 63 | 0 | 0 |
| 64 | 0 | 0 |
| 65 | 0 | 0 |
| 66 | 0 | 0 |
| 67 | 115 | 79 |
| 68 | 0 | 0 |
| 69 | 118 | 28 |
| 70 | 0 | 0 |
| 71 | 51 | 46 |
| 72 | 0 | 0 |
| 73 | 45 | 10 |
| 74 | 15 | 7 |
| 75 | 126 | 61 |
| 76 | 99 | 73 |
| 77 | 81 | 43 |
| 78 | 0 | 0 |
| 79 | 63 | 3 |
| 80 | 0 | 0 |
| 81 | 0 | 0 |
| 82 | 68 | 66 |
| 83 | 0 | 0 |
| 84 | 113 | 49 |
| 85 | 0 | 0 |
| 86 | 0 | 0 |
| 87 | 0 | 0 |
| 88 | 95 | 52 |
| 89 | 38 | 11 |
| 90 | 0 | 0 |
| 91 | 82 | 60 |
| 92 | 112 | 100 |
| 93 | 92 | 14 |
| 94 | 0 | 0 |
| 95 | 0 | 0 |
| 96 | 0 | 0 |
| 97 | 58 | 40 |
| 98 | 123 | 78 |
| 99 | 87 | 26 |
| 100 | 69 | 23 |
| 101 | 127 | 31 |
| 102 | 41 | 22 |
| 103 | 32 | 2 |
| 104 | 0 | 0 |
| 105 | 0 | 0 |
| 106 | 0 | 0 |
| 107 | 0 | 0 |
| 108 | 83 | 6 |
| 109 | 105 | 94 |
| 110 | 110 | 71 |
| 111 | 0 | 0 |
| 112 | 93 | 84 |
| 113 | 77 | 44 |
| 114 | 64 | 16 |
| 115 | 80 | 65 |
| 116 | 0 | 0 |
| 117 | 0 | 0 |
| 118 | 111 | 53 |
| 119 | 0 | 0 |
| 120 | 86 | 39 |
| 121 | 104 | 33 |
| 122 | 0 | 0 |
| 123 | 0 | 0 |
| 124 | 116 | 17 |
| 125 | 0 | 0 |
| 126 | 0 | 0 |
| 127 | 1 | 0 |
| 128 | 0 | 0 |
| 129 | 0 | 0 |
| 130 | 0 | 0 |
| 131 | 0 | 0 |
| 132 | 0 | 0 |
| 133 | 0 | 0 |
| 134 | 102 | 30 |
| 135 | 0 | 0 |
| 136 | 0 | 0 |
| 137 | 0 | 0 |
| 138 | 108 | 55 |
| 139 | 0 | 0 |
| 140 | 0 | 0 |
| 141 | 76 | 59 |
| 142 | 101 | 91 |
| 143 | 0 | 0 |
| 144 | 0 | 0 |
| 145 | 0 | 0 |
| 146 | 89 | 19 |
| 147 | 0 | 0 |
| 148 | 29 | 13 |
| 149 | 109 | 88 |
| 150 | 124 | 121 |
| 151 | 0 | 0 |
| 152 | 70 | 18 |
| 153 | 0 | 0 |
| 154 | 85 | 34 |
| 155 | 117 | 24 |
| 156 | 0 | 0 |
| 157 | 74 | 54 |
| 158 | 125 | 5 |
| 159 | 0 | 0 |
| 160 | 0 | 0 |
| 161 | 0 | 0 |
| 162 | 0 | 0 |
| 163 | 0 | 0 |
| 164 | 8 | 4 |
| 165 | 50 | 37 |
| 166 | 0 | 0 |
| 167 | 0 | 0 |
| 168 | 98 | 97 |
| 169 | 57 | 25 |
| 170 | 0 | 0 |
| 171 | 90 | 48 |
| 172 | 0 | 0 |
| 173 | 120 | 114 |
| 174 | 0 | 0 |
| 175 | 0 | 0 |
| 176 | 103 | 62 |
| 177 | 35 | 12 |
| 178 | 75 | 21 |
| 179 | 0 | 0 |
| 180 | 0 | 0 |
| 181 | 67 | 42 |
| 182 | 119 | 36 |
| 183 | 106 | 47 |
| 184 | 96 | 72 |
| 185 | 0 | 0 |
| 186 | 56 | 27 |
| 187 | 107 | 20 |
| 188 | 0 | 0 |
| 189 | 122 | 9 |
| 190 | 0 | 0 |
| 191 | 0 | 0 |
| 192 | 0 | 0 |
| 193 | 0 | 0 |
| 194 | 115 | 79 |
| 195 | 0 | 0 |
| 196 | 118 | 28 |
| 197 | 0 | 0 |
| 198 | 51 | 46 |
| 199 | 0 | 0 |
| 200 | 45 | 10 |
| 201 | 15 | 7 |
| 202 | 126 | 61 |
| 203 | 99 | 73 |
| 204 | 81 | 43 |
| 205 | 0 | 0 |

TABLE III-continued

| I | E1 | E2 |
|---|----|----|
| 206 | 63 | 3 |
| 207 | 0 | 0 |
| 208 | 0 | 0 |
| 209 | 68 | 66 |
| 210 | 0 | 0 |
| 211 | 113 | 49 |
| 212 | 0 | 0 |
| 213 | 0 | 0 |
| 214 | 0 | 0 |
| 215 | 95 | 52 |
| 216 | 38 | 11 |
| 217 | 0 | 0 |
| 218 | 82 | 60 |
| 219 | 112 | 100 |
| 220 | 92 | 14 |
| 221 | 0 | 0 |
| 222 | 0 | 0 |
| 223 | 0 | 0 |
| 224 | 58 | 40 |
| 225 | 123 | 78 |
| 226 | 87 | 26 |
| 227 | 69 | 23 |
| 228 | 127 | 31 |
| 229 | 41 | 22 |
| 230 | 32 | 2 |
| 231 | 0 | 0 |
| 232 | 0 | 0 |
| 233 | 0 | 0 |
| 234 | 0 | 0 |
| 235 | 83 | 6 |
| 236 | 105 | 94 |
| 237 | 110 | 71 |
| 238 | 0 | 0 |
| 239 | 93 | 84 |
| 240 | 77 | 44 |
| 241 | 64 | 16 |
| 242 | 80 | 65 |
| 243 | 0 | 0 |
| 244 | 0 | 0 |
| 245 | 111 | 53 |
| 246 | 0 | 0 |
| 247 | 86 | 39 |
| 248 | 104 | 33 |
| 249 | 0 | 0 |
| 250 | 0 | 0 |
| 251 | 116 | 17 |
| 252 | 0 | 0 |
| 253 | 0 | 0 |
| 254 | 1 | 0 |
| 255 | 0 | 0 |

Figure 3:
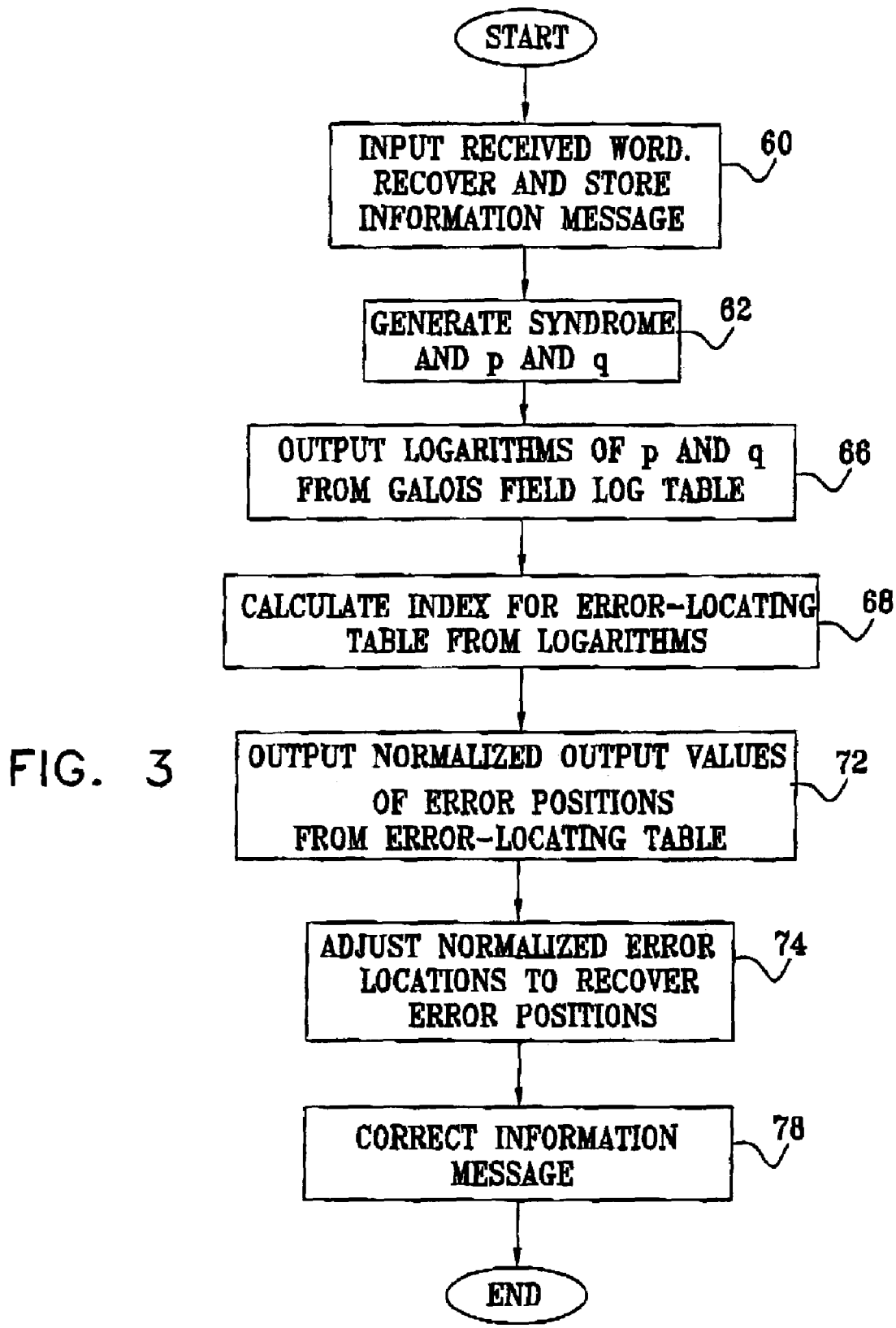
FIG. 3 is a flow chart showing steps implemented by the decoder of FIG. 2 in performing error-correcting operations, according to a preferred embodiment of the present invention.
Figure 4:
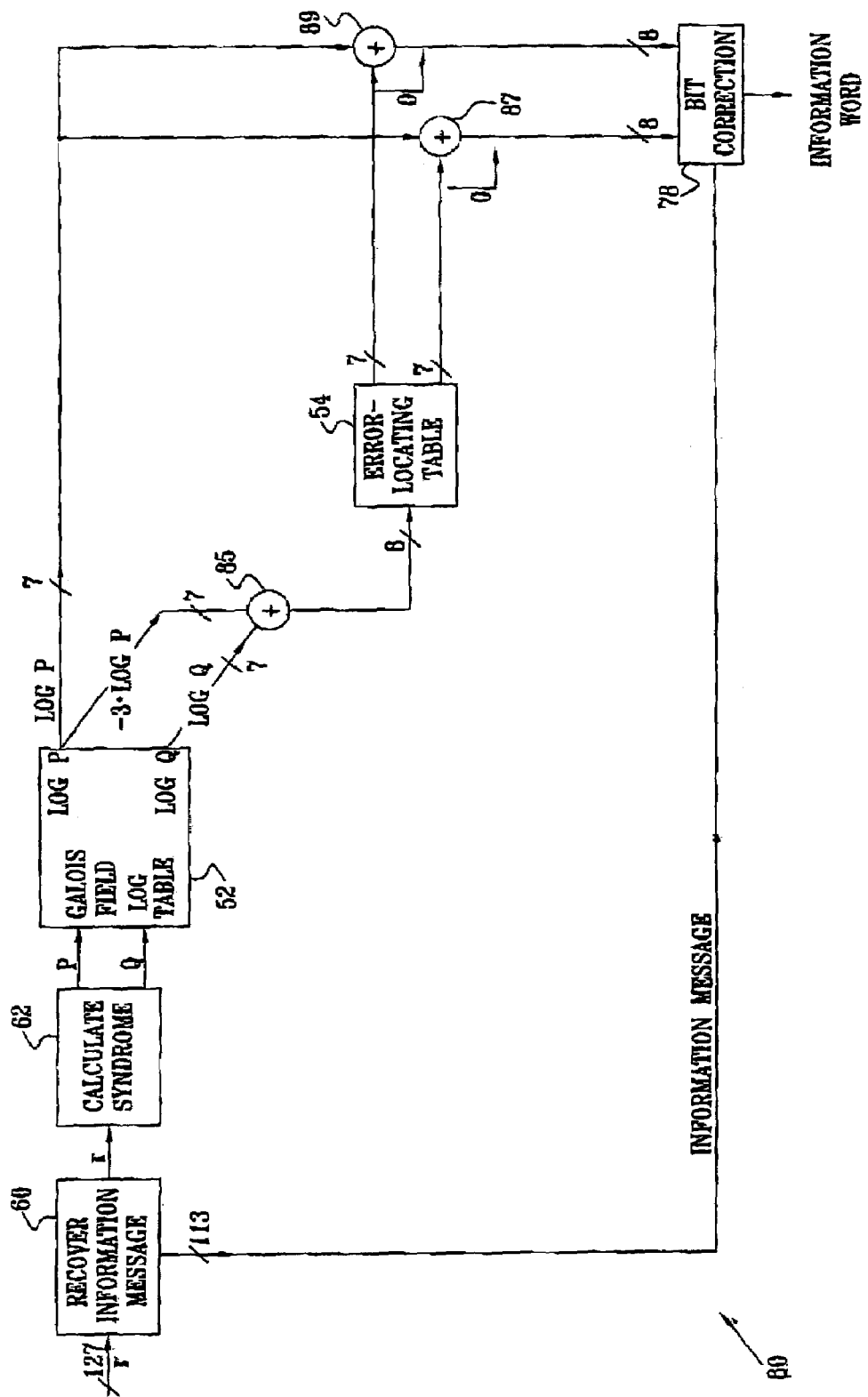
FIG. 4 is a logical flow diagram which schematically illustrates the error-correcting operations of FIG. 3, according to a preferred embodiment of the present invention.

FIG. 3 is a flow chart showing steps implemented by decoder 28 in performing error-correcting operations, and FIG. 4 is a logical flow diagram 80 which schematically illustrates the operations performed, according to a preferred embodiment of the present invention. Elements of FIG. 4 that substantially correspond to elements in FIGS. 1, 2, and 3 are identified by the same numerals.

In the following explanation, a 127 bit code word into which errors have been inserted at positions 72 and 46 of the code word is used as a first example of a received word vector r. (Three other examples of different received words are provided below.)

In a first step 60 vector r, of length 127 bits, is received from RAM 16 by microprocessor 12. Vector r is assumed to have binary elements $r_0, r_1, \ldots, r_{126}$. An information message vector v of length 113 bits is recovered from vector r, by methods known in the art, and is stored in memory 57 for use in a final step of the error-correcting operations.

In a second step 62 circuitry 50 generates elements p, q of syndrome s. For errors at positions 72 and 46, circuitry 50 determines that p and q are equal to (1 1 1 0 1 1 1) and (0 1 1 0 0 1 0) respectively.

In a step 66 p and q are used as indices to Galois Field logarithm table 52, to find log p and log q. As shown in Table II, log p is 100 and log q is 122. A value of −3log p is also calculated, to be used in calculating index I.

In an index calculation step 68, decoder 28 calculates I according to equation (11), repeated here for convenience. I is calculated by summing log q and −3log p in an adder 85 to form an 8-tuple vector.

$$I = \mod(127)[\log q - 3 \cdot \log p] \quad (11)$$

In an output step 72, table 54 generates two output values, from column E1 and column E2, corresponding to normalized values for two error positions. In the example considered herein, I=mod(127)[122−3·100]=76, and the value 76 generates a first normalized error position 99 and a second position 73.

In a reconstitution step 74, the outputs of Table 54 are "un-normalized" by finding the result of adding log p to the outputs, to recover the actual error positions in received word r. Thus, log p acts as an adjusting logarithm. The additions are performed in adders 87 and 89, which are implemented to add their respective inputs, except in the case of the input from table 54 being zero, in which case adders 87 and 89 generate a result 0.

In the example,

First error position, generated by adder 87, =99+100=199, and

Second error position, generated by adder 89, =73+100=173.

In a final bit correction step 78, the bit error positions determined in step 74 are corrected by having a mod(127) operation applied. The corrected values, assuming they comprise values included in the more significant 113 bits of the information message, correspond to error positions in the information message. Thus, in the example, first corrected value=mod(127)[199]=72, and second corrected value=mod(127)[173]=46.

The corrected values are then applied to the 113 bits of information message vector v in order to correct the received message. (If the corrected values correspond to values included in the less significant parity-check bits of the received word, no correction is made to the information message.)

As a second example a received (127, 113) vector r has two errors at positions 70 and 44, so that the "normalized" error location vector is the same as that of the first example described above, since the position differences 70−44=72−46. In the case of the second example, p=123 and q=46, (p, q are here written as decimals) so that log p=98 and log q=116. I=76, as in the first example, since the normalized error position vectors are identical. Thus, Table 54 generates the same first normalized error position 99 and the same second normalized error position 73. The error positions are recovered by adding log p, i.e. 98, to the two normalized positions and finding the mod(127) value of the sum. Thus, final error positions are mod(127)[99+98]=70 and mod(127)[73+98]=44.

As a third example a received (127,113) vector r has a single error at position 50. In this example p=97 and q=114, so that log p=49 and log q=20. I=mod(127)[20−147]=0. Table 54 generates E1=1 and E2=0, and these values are passed to adders 89 and 87. For E1=1, adder 89 generates an uncorrected error position 49+1=50, and bit correction step 78 generates a corrected value mod(127)[49+1]=50. Since E2=0, adder 87 generates an error position 0, indicating that there is no second error.

As a fourth example a received (127,113) vector r has no errors. In this example p=0 and q=0, so that log p=127 and log q=127. I=mod(127)[127−381]=0. Table 54 generates E1=1 and E2=0, and these values are passed to adders 89 and 87. Both adders also receive the value of log p, 127. Adder 89 thus generates a value 128 and bit correction step 78 generates a corrected error value mod(127)[128]=1. The "1" position does not indicate an error in the more significant bits of the received vector, so no correction is made in the information word of the vector. As for the third example, since E2=0 adder 87 generates an error position 0. Thus, there is neither a first nor a second error.

It will be understood that the processes illustrated by flow diagram 80, of normalization and "un-normalization," may be implemented because the BCH code words are cyclic. It will be further appreciated from the above that received words may be classified into three categories:

No erroneous bits, where p and q=0;
One erroneous bit, where I=0;
Two erroneous bits, where the conditions for no erroneous bits and one erroneous bit are not true.

Decoder 28 operating according to logical flow diagram 80 is able to determine error positions for BCH codes for integral values of m, where ($2^m$−1) is not divisible by 3, i.e., m is an odd integer. For m being an even or an odd integer, adjustment circuitry 51 is incorporated into the flow diagram of FIG. 4, the circuitry enabling decoder 28 to correctly identify two possible situations for two erroneous bits.

Figure 5:
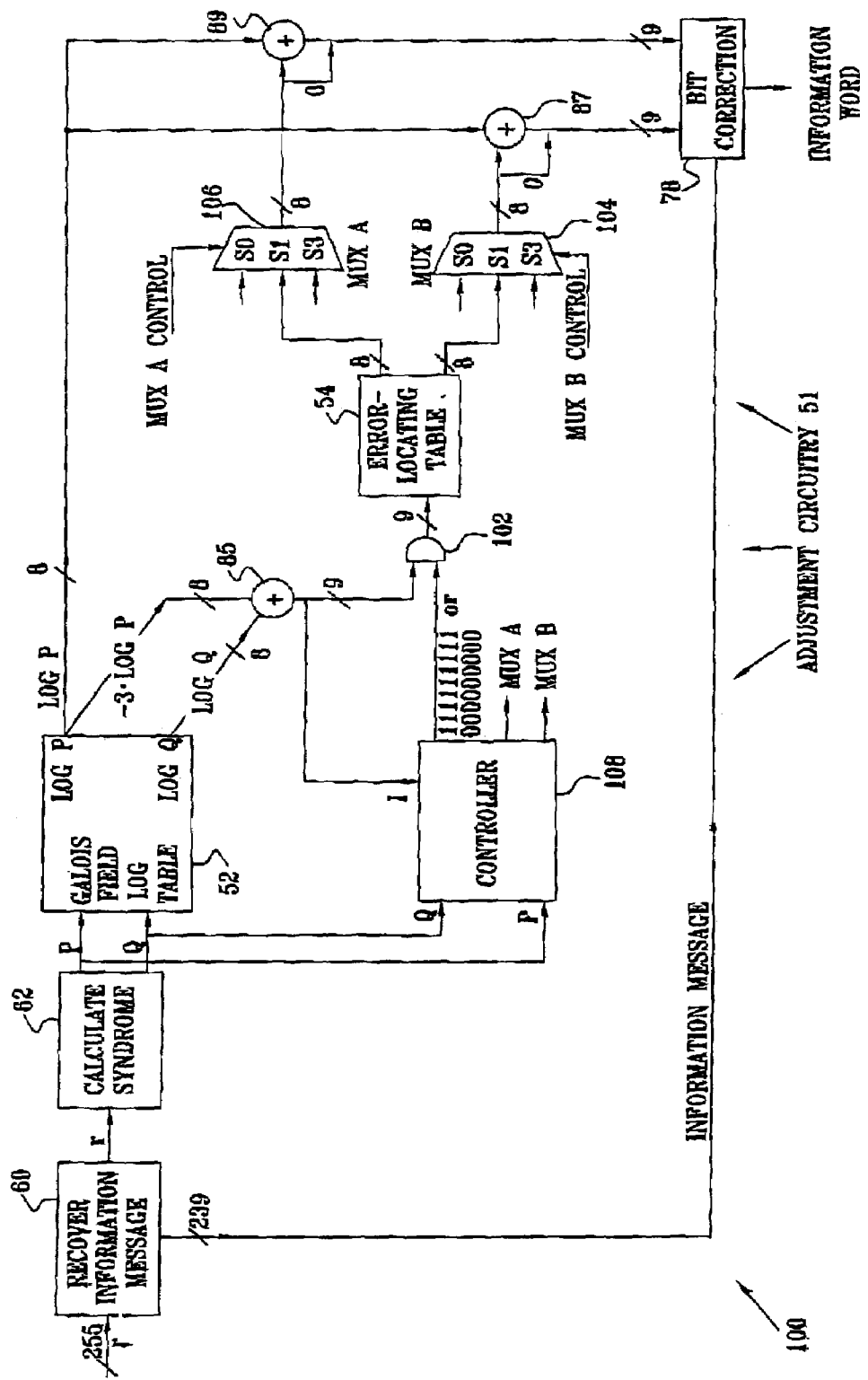
FIG. 5 is an alternative logical flow diagram which schematically illustrates the error-correcting operations of FIG. 3, according to a preferred embodiment of the present invention.

FIG. 5 is an alternative logical flow diagram 100 which schematically illustrates the operations performed by decoder 28 when the decoder follows the steps of FIG. 3, according to a preferred embodiment of the present invention. Flow diagram 100 applies for m as an even or as an odd integer. Apart from the differences described below, logical flow diagram 100 is generally similar to logical flow diagram 80, so that elements indicated by the same reference numerals in both diagrams 80 and 100 are generally identical in operation. By way of example, decoder 28 is assumed to operate on a received word where m=8, for a (255, 239) BCH code. In this case, Galois Field Logarithm Table 52 comprises elements of $GF(2^8)$, the undefined value corresponding to decimal vector 0 being set to 255, and the table outputting 8-tuples.

As described above with respect to flow diagram 80, error-locating table 54 may be generated by creating known examples of the 255 normalized error vectors existing for the case of m=8. Indexes I for the error-locating table are preferably stored as 9-tuples, since adder 85 adds two 8-tuple vectors.

Adders 85, 87, and 89 operate generally as described for flow diagram 80, so that if adder 87 or 89 receives 0 from table 54 the adder outputs 0.

Adjustment circuitry 51 comprises an AND gate 102 which receives as a first input the result from adder 85. The AND gate outputs the index I used by error-locating table 54. Circuitry 51 also comprises two multiplexers 104 and 106, each having three ports S0, S1, and S3. Ports S1 receive their outputs from table 54. Ports S0 receive as inputs an 8-tuple vector (0 0 0 0 0 0 0 0). Port S3 of multiplexer 104 receives an 8-tuple vector (0 0 0 0 0 0 0 0); port S3 of multiplexer 106 receives an 8-tuple vector (0 0 0 0 0 0 0 1), where the "1" is a least significant bit.

Adjustment circuitry 51 further comprises an adjustment controller 108 which receives inputs of p, q, and I. Controller 108 uses these inputs to generate control signals for multiplexers 104 and 106, to choose which port is coupled to the output of the multiplexer. Controller 108 also generates a second input to gate 102, as a 9-tuple vector (0 0 0 0 0 0 0 0 0) or (1 1 1 1 1 1 1 1 1), so that gate 102 respectively outputs (0 0 0 0 0 0 0 0) or the value received from adder 85.

Table IV below shows inputs and outputs for controller 108. For clarity, an n-tuple vector having all elements equal to 0 is written as =0; if one or more elements of the vector is not equal to 0, the vector is written as ≠0.

TABLE IV

| Inputs to controller 108 | Outputs set by controller 108 | Number of errors in received word |
|---|---|---|
| p=0; q=0 | S0 connected | No erroneous bits |
| p≠0; q=0 | AND gate input to (0 0 0 0 0 0 0 0 0). S1 connected | Two erroneous bits |
| p≠0; q≠0; I=0 | S3 connected | One erroneous bit |
| p≠0; q≠0; I≠0 | AND gate input to (1 1 1 1 1 1 1 1 1). S1 connected | Two erroneous bits |

From inspection of Table IV, it will be understood that the operations of controller 108 enable two cases for two erroneous bit to be detected by decoder 28.

It will be understood that elements 85, 87, and 89 in FIGS. 4 and 5, and elements 102, 104, 106, and 108 in FIG. 5, are most preferably implemented as hardware objects in microprocessor 12, using any convenient method known in the art. Alternatively, at least some of these elements may be wholly or partly implemented in software.

It will be appreciated that, while the examples above have assumed an (n,k) code having t=2, the scope of the present invention includes, mutatis mutandis, other (n,k) codes, having other values of t. For example, for codes with t=3, the syndrome would be generated as three values p, q, and a third value u, and table 52 would output 3 corresponding logarithm values. Error-locating table 54 would be generated generally as described above for t=2 codes, using normalized error position vectors of the form (1 1 1 0 0 . . . 0), (1 1 0 1 0 0 . . . 0), (1 1 0 0 1 0 . . . 0), . . . Error-locating table 54 would output 3 normalized values, which would be corrected by processes generally similar to those described above for t=2 codes.

The processes described above for detecting and correcting errors in received words use look-up tables that are extremely small compared to decoding look-up tables used in methods known in the art, and the number of processing cycles needed to perform the processes described are small. The steps in the processes may be performed in parallel, so that pipeline processing may be implemented and the effective number of processing cycles may be further reduced. Optionally table 52 and/or table 54 may be replicated, so improving the processing time. For example, three substantially identical tables 52 may be implemented, having respective inputs p, p and q, and respective outputs log p, −3log p, and log q. Other variations for implementing the processes described above will be apparent to those skilled in the art; all such variations are assumed to be comprised within the scope of the present invention.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for decoding a received word, comprising:
calculating a syndrome of the received word as a plurality of binary element vectors;
generating respective logarithms of the binary element vectors; and
determining, in response to the logarithms, an indication of a position of an erroneous bit in the received word,
wherein the received word is formed from a code word of a Bose, Chaudhuri, and Hocquenghem (BCH) code having an error-correction value, and wherein the plurality is equal to the error-correction value,
wherein the error-correction value is equal to two, wherein generating respective logarithms comprises generating a first logarithm log p and a second logarithm log q, and wherein determining the indication comprises generating an index I to an error-locating table from an expression (log q−3log p).

2. A method according to claim 1, and comprising making a comparison of the index I with zero, and in response to the comparison determining that the erroneous bit comprises a single erroneous bit.

3. A method for decoding a received word, comprising:
calculating a syndrome of the received word as a plurality of binary element vectors;
generating respective logarithms of the binary element vectors; and
determining, in response to the logarithms, an indication of a position of an erroneous bit in the received word,
wherein generating the respective logarithms comprises using each of the binary vectors as an index to a Galois Field logarithm table,
wherein the received word is formed from a code word of a BCH code having a block length equal to $2^m-1$, wherein m is an integer greater than or equal to three, wherein a number of elements in each binary element vector is equal to m, and wherein the Galois Field logarithm table comprises elements of order $GF(2^m)$.

4. A method according to claim 3, and comprising providing adjustment circuitry which is adapted to adjust the indication of the position of the erroneous bit for m being an odd integer or an even integer.

5. A method for decoding a received word, comprising:
calculating a syndrome of the received word as a plurality of binary element vectors;
generating respective logarithms of the binary element vectors; and
determining, in response to the logarithms, an indication of a position of an erroneous bit in the received word,
wherein determining the indication comprises generating an index to an error-locating table as a pre-determined function of the respective logarithms.

6. A method according to claim 5, wherein the received word is formed from a code word of a Bose, Chaudhuri, and Hocquenghem (BCH) code having an error-correction value greater than or equal to two, and wherein the plurality is equal to the error-correction value.

7. A method according to claim 5, and comprising recovering an information message from the received word, and applying the indication of the position of the erroneous bit to the information message so as to determine an information word.

8. A method according to claim 5, wherein generating the respective logarithms comprises using each of the binary vectors as an index to a Galois Field logarithm table.

9. A method according to claim 5, wherein the received word comprises a known-erroneous-bit-position word, wherein the position of the erroneous bit in the known-erroneous-bit-position word is known, and comprising generating the error-locating table using the known-erroneous-bit-position word.

10. A method according to claim 9, wherein the known-erroneous-bit-position word comprises a normalized error vector.

11. A method according to claim 8, wherein the received word is formed from a code word of a BCH code having an error-correction value, and wherein the error-locating table is implemented to generate the indication as a multiplicity of pointers, the multiplicity being equal to the error-correction value.

12. A method according to claim 8, wherein generating the index comprises generating an adjustment to the index in response to at least one of the plurality of binary element vectors and the index.

13. A method according to claim 8, and comprising adjusting an output of the error-locating table in response to at least one of the plurality of binary element vectors and the index.

14. A method for decoding a received word, comprising:
calculating a syndrome of the received word as a plurality of binary element vectors;
generating respective logarithms of the binary element vectors; and
determining, in response to the logarithms, an indication of a position of an erroneous bit in the received word,
wherein generating the respective logarithms comprises generating an index to an error-locating table as a pre-determined function of the respective logarithms, and wherein determining the indication comprises:
determining a plurality of pointers to respective positions of erroneous bits; and
receiving from the error-locating table the plurality of pointers.

15. A method according to claim 14, and comprising adjusting the plurality of pointers in response to an adjusting logarithm comprised in the logarithms, so as to determine respective positions of the erroneous bits.

16. Apparatus for decoding a received word, comprising:
a processor which is adapted to:
calculate a syndrome of the received word as a plurality of binary element vectors,
generate respective logarithms of the binary element vectors, and
determine, in response to the logarithms, an indication of a position of an erroneous bit in the received word,
wherein the received word is formed from a code word of a Bose, Chaudhuri, and Hocquenghem (BCH) code having an error-correction value, and wherein the plurality is equal to the error-correction value,
wherein the error-correction value is equal to two, wherein the respective logarithms comprise a first logarithm log p and a second logarithm log q, and wherein the indication comprises an index I to an error-locating table including an expression (log q−3log p).

17. Apparatus according to claim 16, wherein the processor is adapted to make a comparison of the index I with zero, and in response to the comparison to determine that the erroneous bit comprises a single erroneous bit.

18. Apparatus for decoding a received word, comprising:
a processor which is adapted to:
calculate a syndrome of the received word as a plurality of binary element vectors,
generate respective logarithms of the binary element vectors, and
determine, in response to the logarithms, an indication of a position of an erroneous bit in the received word,
wherein the processor is adapted to generate the respective logarithms using each of the binary element vectors as an index to a Galois Field logarithm table,
wherein the received word is formed from a code word of a BCH code having a block length equal to $2^m-1$, wherein m is an integer greater than or equal to three, wherein a number of elements in each binary element vector is equal to m, and wherein the Galois Field logarithm table comprises elements of order $GF(2^m)$.

19. Apparatus according to claim 18, and comprising adjustment circuitry which is adapted to adjust the indication of the position of the erroneous bit for m being an odd integer or an even integer.

20. Apparatus for decoding a received word, comprising:
a processor which is adapted to:
calculate a syndrome of the received word as a plurality of binary element vectors,
generate respective logarithms of the binary element vectors, and
determine, in response to the logarithms, an indication of a position of an erroneous bit in the received word,
wherein the indication comprises an index to an error-locating table as a pre-determined function of the respective logarithms.

21. Apparatus according to claim 20, wherein the received word is formed from a code word of a Bose, Chaudhuri, and Hocquenghem (BCH) code having an error-correction value greater than or equal to two, and wherein the plurality is equal to the error-correction value.

22. Apparatus according to claim 20, wherein the processor is adapted to recover an information message from the received word, and to apply the indication of the position of the erroneous bit to the information message so as to determine an information word.

23. Apparatus according to claim 20, wherein the processor is adapted to generate the respective logarithms using each of the binary element vectors as an index to a Galois Field logarithm table.

24. Apparatus according to claim 20, wherein the received word comprises a known-erroneous-bit-position word, wherein the position of the erroneous bit in the known-erroneous-bit-position word is known, and wherein the processor is adapted to generate the error-locating table using the known-erroneous-bit-position word.

25. Apparatus according to claim 24, wherein the known-erroneous-bit-position word comprises a normalized error vector.

26. Apparatus according to claim 20, wherein the received word is formed from a code word of a BCH code having an error-correction value, and wherein the error-locating table is implemented to generate the indication as a multiplicity of pointers, the multiplicity being equal to the error-correction value.

27. Apparatus according to claim 20, and comprising adjustment circuitry which is adapted to generate an adjustment to the index in response to at least one of the plurality of binary element vectors and the index.

28. Apparatus according to claim 20, and comprising adjustment circuitry which is adapted to adjust an output of the error-locating table in response to at least one of the plurality of binary element vectors and the index.

29. Apparatus for decoding a received word, comprising:
a processor which is adapted to:
calculate a syndrome of the received word as a plurality of binary element vectors,
generate respective logarithms of the binary element vectors, and
determine, in response to the logarithms, an indication of a position of an erroneous bit in the received word,
wherein the processor is adapted to generate an index to an error-locating table as a pre-determined function of the respective logarithms, and wherein the indication comprises a plurality of pointers to respective positions of erroneous bits, and wherein the processor is adapted to receive from the error-locating table the plurality of pointers.

30. Apparatus according to claim 29, wherein the processor is adapted to adjust the plurality of pointers in response to an adjusting logarithm comprised in the logarithms, so as to determine respective positions of the erroneous bits.

* * * * *